United States Patent
Zhang et al.

(10) Patent No.: US 9,323,052 B2
(45) Date of Patent: Apr. 26, 2016

(54) LITHOGRAPHY PUPIL SHAPING OPTICAL SYSTEM AND METHOD FOR GENERATING OFF-AXIS ILLUMINATION MODE

(71) Applicant: Shanghai Institute of Optics and Fine Mechanics Chinese Academy of Sciences, Shanghai (CN)

(72) Inventors: Fang Zhang, Shanghai (CN); Jing Zhu, Shanghai (CN); Huijie Huang, Shanghai (CN); Qiang Song, Shanghai (CN); Baoxi Yang, Shanghai (CN); Ming Chen, Shanghai (CN); Aijun Zeng, Shanghai (CN); Lihua Huang, Shanghai (CN); Zhonghua Hu, Shanghai (CN); Yanfen Xiao, Shanghai (CN)

(73) Assignee: Shanghai Institute of Optics and Fine Mechanics Chinese Academy of Sciences, Shanghai (CN)

( * ) Notice: Subject to any disclaimer, the term of this patent is extended or adjusted under 35 U.S.C. 154(b) by 0 days.

(21) Appl. No.: 14/419,629

(22) PCT Filed: Apr. 28, 2013

(86) PCT No.: PCT/CN2013/000492
§ 371 (c)(1),
(2) Date: Feb. 4, 2015

(87) PCT Pub. No.: WO2014/146220
PCT Pub. Date: Sep. 25, 2014

(65) Prior Publication Data
US 2016/0004074 A1 Jan. 7, 2016

(30) Foreign Application Priority Data
Mar. 22, 2013 (CN) .......................... 2013 1 0096140

(51) Int. Cl.
*G02B 26/08* (2006.01)
*G02B 27/00* (2006.01)
(Continued)

(52) U.S. Cl.
CPC ............ *G02B 27/0081* (2013.01); *G02B 5/001* (2013.01); *G02B 5/1838* (2013.01);
(Continued)

(58) Field of Classification Search
CPC ...... G03F 7/20; G02B 5/001; G02B 26/0816; G02B 27/0081; G02B 27/283; G02B 27/4222; G02B 5/1838
See application file for complete search history.

(56) References Cited

U.S. PATENT DOCUMENTS 7,548,302 B2 * 6/2009 Bleeker .................. G03B 27/54
355/67

FOREIGN PATENT DOCUMENTS

| CN | 101916047 | 12/2010 |
| CN | 102929107 | 2/2013 |

OTHER PUBLICATIONS

Leonard, et al., "An Improved Process for Manufacturing Diffractive Optical Elements (DOEs) for Off-Axis Illumination Systems." Optical Microlithography XXI, Proc. Of SPIE, vol. 6924, 69242O, Mar. 14, 2008.

*Primary Examiner* — James Phan
(74) *Attorney, Agent, or Firm* — Cesari and McKenna LLP

(57) ABSTRACT

A lithography pupil shaping optical system and method for generating off-axis illumination mode. The invention is composed of illumination mode generation unit, rotatable wave plate, polarization beam splitter unit, ring I generation unit and ring II generation unit. Through selecting corresponding diffractive optical element and appropriate adjustment, this invention can generate various illumination modes including single ring illumination mode and double ring illumination mode. The intensity at pupil plane and the inner and outer diameters of the off-axis illumination mode can be adjusted continuously.

2 Claims, 5 Drawing Sheets

(51) Int. Cl.
*G02B 27/09* (2006.01)
*G03F 7/20* (2006.01)
*G02B 5/00* (2006.01)
*G02B 5/18* (2006.01)
*G02B 27/28* (2006.01)
*G02B 27/42* (2006.01)

(52) U.S. Cl.
CPC ........ *G02B26/0816* (2013.01); *G02B 27/0905* (2013.01); *G02B 27/0911* (2013.01); *G02B 27/0972* (2013.01); *G02B 27/283* (2013.01); *G02B 27/4222* (2013.01); *G03F 7/20* (2013.01); *G03F 7/70091* (2013.01)

LITHOGRAPHY PUPIL SHAPING OPTICAL SYSTEM AND METHOD FOR GENERATING OFF-AXIS ILLUMINATION MODE

CROSS-REFERENCE TO RELATED APPLICATIONS

This application is the National Stage of International Application No. PCT/CN2013/000492, filed on Apr. 28, 2013, which claims the benefit of Chinese Application No. 201310096140.9, filed on Mar. 22, 2013. The contents of both Applications are hereby incorporated by reference in their entirety.

BACKGROUND OF THE INVENTION

1. Field of the Invention

The invention relates to optical lithography field, especially for a lithography pupil shaping optical system and method for generating off-axis illumination mode. The invention is a pupil shaping optical system, which can generate single ring illumination mode and double ring illumination mode. The intensity at pupil plane and the inner and outer diameters of the off-axis illumination mode can be adjusted continuously.

2. Background Information

As a kind of key semiconductor processing equipment, the resolution of optical lithography machine is one of the important specifications to evaluate its performance. From the equations of resolution and depth of focus, it is known that shortening the exposure wavelength and increasing the numerical aperture of the projection lens are effective methods to improve the lithography resolution. But the application of these methods to improve lithography resolution will also decrease the depth of focus and reduce the edge steepness of exposure line edge. Recently, researchers have proposed a variety of lithography resolution enhancement technologies, which improve the lithography resolution while ensuring the required depth of focus. These enhancement technologies mainly include off-axis illumination, phase shift mask, optical proximity effect correction and advanced lithography process technology. Among them the off-axis illumination is a kind of commonly adopted lithography resolution enhancement technology.

In an optical lithography machine, the objective of pupil shaping is to obtain various off-axis illumination modes. Usually, a specially designed optical element which modulates the intensity or phase distribution of the incident laser beam is adopted to obtain specified intensity distribution at pupil plane. The diffractive optical element is commonly used to achieve pupil shaping. It modulates the amplitude or phase of the beam incident on it. The specific diffraction pattern, such as annular, dipole, quadrupole or etc, is generated in the far field. The inner and outer diameters of the pattern at pupil plane can be changed by adjusting the focal length of the zoom collimating lens group and the distance between the convex and concave of the axicon pairs. The zoom collimating lens group is composed by a set of lenses and their positions could be adjusted. Based on the lithography simulation results, the selection of the pupil distribution in off-axis illumination is mainly depend on the shape, distribution and size of the mask pattern and the numerical aperture of the optical lithography machine. With the increasement of numerical aperture, the decreasement of the feature size of lithographic pattern and the improvement of its distribution density, a variety of new off-axis illumination modes appear, such as double annular, double dipole and double quadrupole.

The Chinese Laid-Open Patent Applications CN101916045A and CN101916046A disclose two freeform lenses which are used to generate double dipole and double annular illumination modes respectively. In their design the principle is that the incident light deflected by the designed transmission surfaces with specific shapes into specified direction to obtain different illumination modes. But this technique has the following disadvantages: The shape of the curved surfaces is complicated to realize; The intensity distributions of the inner and outer rings and their inner and outer diameters are non-adjustable. Therefore, they are non-flexible and not suitable for different photolithographic mask patterns.

SUMMARY OF THE INVENTION

The purpose of this invention is to overcome the shortages of the above technologies. A lithography pupil shaping optical system is implemented and method for generating off-axis illumination mode is proposed. The invention is a pupil shaping optical system which can generate single ring illumination mode or double ring illumination mode. The intensity at pupil plane and the inner and outer diameters of the off-axis illumination mode can be adjusted continuously.

Before the presentation of the technical solution to this invention, for ease understanding, some basic concepts involved in this invention are defined as follows:

1. This invention can generate different illumination modes such as annular, dipole, quadrupole, double annular, double dipole, double quadrupole and etc. Among the generated modes, the general illumination modes which just have one ring such as annular, dipole, quadrupole and etc illustrated in FIG. 2a, FIG. 2c, FIG. 2e and FIG. 2g are named as single ring illumination. The illumination modes which have two rings such as double annular, double dipole, double quadrupole and etc illustrated in FIG. 2b, FIG. 2d, FIG. 2f and FIG. 2h are named as double ring illumination. In the FIG. 2a, FIG. 2b, FIG. 2c, FIG. 2d, FIG. 2e, FIG. 2f, FIG. 2g and FIG. 2h, the broken circles labeled by 7 and 8 are auxiliary lines. The broken circles 7 and 8 are concentric with the single ring and double ring illumination modes, and w, w' are the widths of the corresponding rings.

2. The definitions of x-axis, y-axis, z-axis and their origins are illustrated in FIG. 3. The y-axis passed through the centers of the broken rings 7 and 8 and its positive direction is bottom up of the paper's surface. The coordinate origin is the intersection of y-axis and polarization splitting film. The positive direction of the z-axis is from left to right of paper's surface. The plane xOz is parallel to the plane of the broken ring 7 and 8. The coordinate is a left-handed system.

3. In the generation of different illumination modes, the shape and size of the cross section of the beam are different for different position along the light transmission direction. The intensity distribution similar to single ring illumination mode is presented as single ring illumination. The intensity distribution similar to double ring illumination mode is presented as double ring illumination. The coherent factor in off-axis illumination mode is expressed by the beam diameter.

The technical solution to this invention is:

A lithography pupil shaping optical system is composed of illumination mode generation unit, rotatable wave plate, polarization beam splitter unit, ring I generation unit and ring II generation unit. Said illumination mode generation unit is composed of diffractive optical element and zoom collimating lens group. Diffractive optical element is exchangeable to achieve conventional, dipole, and quadrupole illumination modes, respectively. Said ring I generation unit is composed of first quarter-wave plate, first convex axicon and first movable mirror. Said ring II generation unit is composed of second quarter-wave plate, second convex axicon and second movable mirror. The positions of the above components are as follows:

Along the positive direction of z-axis, diffractive optical element, zoom collimating lens group, rotatable wave plate, polarization beam splitter unit, first quarter-wave plate, first convex axicon and first movable mirror are placed sequentially. The conical tip of said first convex axicon is faced with said first movable mirror. Said first movable mirror is coated with polarization-maintaining reflection film. Said first movable mirror possesses mechanical structures by which the distance between the conical tip of said first convex axicon and said first movable mirror can be adjusted continuously.

The light passing through said polarization beam splitter unit is split into reflected light and transmitted light. And along the direction of reflected light, second quarter-wave plate, second convex axicon and second movable mirror are placed sequentially. The conical tip of said second convex axicon is faced with said second movable mirror. Said second movable mirror is coated with polarization-maintaining reflection film. Said second movable mirror possesses mechanical structures by which the distance between the conical tip of said second convex axicon and said second movable mirror can be adjusted continuously.

The rear surface of said diffractive optical element is placed at the front focal plane of said zoom collimating lens group.

Method for generating off-axis illumination mode using the lithography pupil shaping optical system contains the following steps:

① According to the required illumination mode, select corresponding said diffractive optical element;

② According to the required intensity distribution size of the illumination mode, adjust the focal length of said zoom collimating lens group;

③ According to the required energy distribution relationship of said first single ring beam to said second single ring beam, adjust the angle $\theta_0$ between the fast axis of said rotatable wave plate and x-axis;

④ According to the required inner and outer diameters of said first single ring beam, determine and adjust the distance $d_1$ between the conical tip of said first convex axicon and said first movable mirror;

⑤ According to the required inner and outer diameters of said second single ring beam, determine and adjust the distance $d_2$ between the conical tip of said second convex axicon and said second movable mirror;

⑥ When said first single ring beam in step ④ and said single ring beam in step ⑤ overlap completely or partially, or when the inner or outer diameter of said first single ring beam in step ④ equals the outer or inner diameter of said second single ring beam in step ⑤, single ring illumination mode is obtained; Otherwise, double ring illumination mode is obtained.

The beam incident on said diffractive optical element could be square linearly polarized beam. The beam emitting from said diffractive optical element is single ring beam. Then the single ring beam is collimated by said zoom collimating lens group. Moreover, the size of the single ring beam could be adjusted continuously for continuous adjustment of the focal length of said zoom collimating lens group. And the size of the single ring beam is expressed by $$D = 2f' \sin U'$$

where, D is the diameter of the collimated beam emitted from said illumination mode generation unit, U' is the half diffractive angle of said diffractive optical element, f' is the focal length of said zoom collimating lens group.

The relationship of the polarized light p and s emitted from said rotatable wave plate to the polarized light p and s incident on said rotatable wave plate is expressed by $$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

where, $A_s$ and $A_p$ are the components along x-axis and y-axis of the linearly polarized beam incident on said rotatable wave plate, $\delta$ is the phase delay difference of the fast and slow axis of said rotatable wave plate, $\theta_0$ is the angle between the fast axis of said rotatable wave plate and x-axis, $A'_s$ and $A'_p$ are the components along x-axis and y-axis of the linearly polarized beam emitted from said rotatable wave plate.

The energy ratio of polarized light p to s emitted from said rotatable wave plate is about $A'^2_p : A'^2_s$.

The angle $\theta_0$ between the fast axis of said rotatable wave plate and x-axis can be adjusted by said rotatable wave plate continuously.

The incidence angle of the beam emitted from said rotatable wave plate incident on the polarization splitting film is 45°.

Said polarization beam splitter unit achieve one of the following functions:

① For the 45° incidence angle of the beam incident on said polarization splitting film, the reflectivity and transmittance of polarized light s are close to 100% and 0, the transmittance and reflectivity of polarized light p are close to 100% and 0.

② For the 45° incidence angle of the beam incident on said polarization splitting film, the reflectivity and transmittance of polarized light p are close to 100% and 0, the transmittance and reflectivity of polarized light s are close to 100% and 0.

The polarized light s and p emitted from said rotatable wave plate is separated by said polarization beam splitter unit. One of the polarized lights is transmitted completely, the other one is reflected completely. The transmitted portion is incident onto said ring I generation unit. The reflected portion is incident onto said ring II generation unit.

The angle between the fast axis of said first quarter-wave plate and the positive direction of x-axis could be 45°, −45°, 135° or −135°.

The conical tip of said first convex axicon is faced with said first movable mirror.

Said first movable mirror is coated with polarization-maintaining reflection film. Said first movable mirror can adjust the distance between the conical tip of said first convex axicon and said first movable mirror continuously.

Said ring I generation unit transforms the light incident on it into first single ring beam. The emitting direction of first single ring beam is opposite to the direction of light incident on said ring I generation unit. The first single ring beam is incident onto said polarization beam splitter unit again, and then it is reflected into the pupil plane.

The inner diameter $D_{1i}$ of said first single ring beam is calculated by $$D_{1i}/2 = \left[d_1 + L_1\cot\left(\frac{\theta_1}{2}\right)\right]\frac{-\cos\left(\frac{\theta_1}{2} + \theta_1'\right)\sin\left(\frac{\theta_1}{2}\right)}{\cos(\theta_1')} + L_1$$

where, $$L_1 = -\left[d_1 + \frac{D}{2}\cot\left(\frac{\theta_1}{2}\right)\right]\cot\left(\frac{\theta_1}{2} + \theta_1'\right) - \frac{D}{2}$$

with $$\theta_1' = \arcsin\left(n_1\cos\left(\frac{\theta_1}{2}\right)\right),$$

$n_1$, $\theta_1$ is the index of refraction and the cone angle of said first convex axicon, $d_1$ is the distance between the conical tip of said first convex axicon and said first movable mirror. The cone angle $\theta_1$ of said first convex axicon is the angle between the two bevel edges in the right view when the conical tip of said first convex axicon is placed vertically up.

The width w of said first single ring beam is calculated by the equation $w=D/2$ The outer diameter $D_{1o}$ of said first single ring beam is calculated by the equation $D_{1o}=D_{1i}+D$ The variation ranges of the inner diameter $D_{1i}$ and outer diameter $D_{1o}$ of said first single ring beam are determined by the adjustment range of $d_1$:

$$\frac{\frac{D}{2} - \frac{D}{2}b_1}{a_1} \le d_1 \le \frac{\frac{D_1}{2} - \frac{D}{2}b_1}{a_1}$$

where, $D_1$ is the conical bottom diameter of said first convex axicon, the conical bottom diameter $D_1$ of said first convex axicon is the bottom width in the right view when the conical tip of said first convex axicon is placed vertically up, $a_1$ and $b_1$ is calculated by the following equations:

$$a_1 = -\cos\left(\frac{\theta_1}{2} + \theta_1'\right)\left\{\left[1 - \cot\left(\frac{\theta_1}{2} + \theta_1'\right)\cot\left(\frac{\theta_1}{2}\right)\right]\frac{\sin\left(\frac{\theta_1}{2}\right)}{\cos(\theta_1')} + 1\right\}$$

$$b_1 = \cot\left(\frac{\theta_1}{2}\right)\cos\left(\frac{\theta_1}{2} + \theta_1'\right)\left\{\left[1 + \cot\left(\frac{\theta_1}{2}\right)\cot\left(\frac{\theta_1}{2} + \theta_1'\right)\right]\frac{\sin\left(\frac{\theta_1}{2}\right)}{\cos(\theta_1')} - 1\right\}$$

The angle between the fast axis of said second quarter-wave plate and the positive direction of x-axis could be 45°, −45°, 135° or −135°.

The conical tip of said second convex axicon is faced with said second movable mirror.

Said second movable mirror is coated with polarization-maintaining reflection film. Said second movable mirror can adjust the distance between the conical tip of said second convex axicon and said second movable mirror continuously.

Said ring II generation unit transforms the light incident on it into second single ring beam. The emitting direction of second single ring beam is opposite to the direction of light incident on said ring II generation unit. The second single ring beam is incident onto said polarization beam splitter unit again, and then it is transmitted into the pupil plane.

The inner diameter $D_{2i}$ of said second single ring beam is calculated by $$D_{2i}/2 = \left[d_2 + L_2\cot\left(\frac{\theta_2}{2}\right)\right]\frac{-\cos\left(\frac{\theta_2}{2} + \theta_2'\right)\sin\left(\frac{\theta_2}{2}\right)}{\cos(\theta_2')} + L_2$$

where, $$L_2 = -\left[d_2 + \frac{D}{2}\cot\left(\frac{\theta_2}{2}\right)\right]\cot\left(\frac{\theta_2}{2} + \theta_2'\right) - \frac{D}{2}$$

with $$\theta_2' = \arcsin\left(n_2\cos\left(\frac{\theta_2}{2}\right)\right),$$

$n_2$, $\theta_2$ is the index of refraction and the cone angle of said second convex axicon, $d_2$ is the distance between the conical tip of said second convex axicon and said second movable mirror. The cone angle $\theta_2$ of said second convex axicon is the angle between the two bevel edges in the right view when the conical tip of said second convex axicon is placed vertically up.

The width w of said second single ring beam is calculated by the equation $w=D/2$ The outer diameter $D_{2o}$ of said second single ring beam is calculated by the equation $D_{2o}=D_{2i}+D$ The variation ranges of the inner diameter $D_{2i}$ and outer diameter $D_{2o}$ of said second single ring beam are determined by the adjustment range of $d_2$:

$$\frac{\frac{D}{2} - \frac{D}{2}b_2}{a_2} \le d_2 \le \frac{\frac{D_2}{2} - \frac{D}{2}b_2}{a_2}$$

where, $D_2$ is the conical bottom diameter of said second convex axicon, the conical bottom diameter $D_2$ of said second convex axicon is the bottom width in the right view when the conical tip of said second convex axicon is placed vertically up, $a_2$ and $b_2$ is calculated by the following equations:

$$a_2 = -\cos\left(\frac{\theta_2}{2} + \theta_2'\right)\left\{\left[1 - \cot\left(\frac{\theta_2}{2} + \theta_2'\right)\cot\left(\frac{\theta_2}{2}\right)\right]\frac{\sin\left(\frac{\theta_2}{2}\right)}{\cos(\theta_2')} + 1\right\}$$

$$b_2 = \cot\left(\frac{\theta_2}{2}\right)\cos\left(\frac{\theta_2}{2} + \theta_2'\right)\left\{\left[1 + \cot\left(\frac{\theta_2}{2}\right)\cot\left(\frac{\theta_2}{2} + \theta_2'\right)\right]\frac{\sin\left(\frac{\theta_2}{2}\right)}{\cos(\theta_2')} - 1\right\}$$

The method for generating off-axis double ring illumination mode using this invention contains the following implement methods:

1. For the 45° incidence angle of the beam incident on said polarization splitting film, the reflectivity and transmittance of polarized light s are close to 100% and 0, the transmittance and reflectivity of polarized light p are close to 100% and 0. The outer diameter of said first single ring beam is less than the inner diameter of said second single ring beam:

① According to the required double ring illumination mode, select corresponding said diffractive optical element;

② According to the required ring width w of the double ring illumination mode, determine the focal length f' of said zoom collimating lens group by the follow equation:

$$2w=D=2f' \sin U'$$

Adjust the position(s) of the movable lens(es) of said zoom collimating lens group, so that its focal length equals f'.

③ According to the required energy distribution relationship $(A'_p{}^2:A'_s{}^2)$ of inner and outer rings, determine the angle $\theta_0$ between the fast axis of said rotatable wave plate and x-axis by the following equation:

$$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

Adjust said rotatable wave plate, so that the angle between the fast axis of said rotatable wave plate and x-axis equals $\theta_0$.

④ According to the required inner and outer diameters of inner ring, determine the distance $d_1$ between the conical tip of said first convex axicon and said first movable mirror by the following equation:

$$D_{1i}/2 = \left[d_1 + L_1\cot\left(\frac{\theta_1}{2}\right)\right]\frac{-\cos\left(\frac{\theta_1}{2}+\theta'_1\right)\sin\left(\frac{\theta_1}{2}\right)}{\cos(\theta'_1)} + L_1$$

The adjustment range of the distance $d_1$ between the conical tip of said first convex axicon and said first movable mirror should satisfy the following equation:

$$\frac{\frac{D}{2}-\frac{D}{2}b_1}{a_1} \le d_1 \le \frac{\frac{D_1}{2}-\frac{D}{2}b_1}{a_1}$$

Adjust said first movable mirror, so that the distance between the conical tip of said first convex axicon and said first movable mirror equals $d_1$.

⑤ According to the required inner and outer diameters of outer ring, determine the distance $d_2$ between the conical tip of said second convex axicon and said second movable mirror by the following equation:

$$D_{2i}/2 = \left[d_2 + L_2\cot\left(\frac{\theta_2}{2}\right)\right]\frac{-\cos\left(\frac{\theta_2}{2}+\theta'_2\right)\sin\left(\frac{\theta_2}{2}\right)}{\cos(\theta'_2)} + L_2$$

The adjustment range of the distance $d_2$ between the conical tip of said second convex axicon and said second movable mirror should satisfy the following equation:

$$\frac{\frac{D}{2}-\frac{D}{2}b_2}{a_2} \le d_2 \le \frac{\frac{D_2}{2}-\frac{D}{2}b_2}{a_2}$$

Adjust said second movable mirror, so that the distance between the conical tip of said second convex axicon and said second movable mirror equals $d_2$.

2. For the 45° incidence angle of the beam incident on said polarization splitting film, the reflectivity and transmittance of polarized light s are close to 100% and 0, the transmittance and reflectivity of polarized light p are close to 100% and 0. The inner diameter of said first single ring beam is greater than the outer diameter of said second single ring beam:

① According to the required double ring illumination mode, select corresponding said diffractive optical element;

② According to the required ring width w of the double ring illumination mode, determine the focal length f' of said zoom collimating lens group by the follow equation:

$$2w=D=2f' \sin U'$$

Adjust the position(s) of the movable lens(es) of said zoom collimating lens group, so that its focal length equals f'.

③ According to the required energy distribution relationship $(A'_p{}^2:A'_s{}^2)$ of inner and outer rings, determine the angle $\theta_0$ between the fast axis of said rotatable wave plate and x-axis by the following equation:

$$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

Adjust said rotatable wave plate, so that the angle between the fast axis of said rotatable wave plate and x-axis equals $\theta_0$.

④ According to the required inner and outer diameters of inner ring, determine the distance $d_2$ between the conical tip of said second convex axicon and said second movable mirror by the following equation:

$$D_{2i}/2 = \left[d_2 + L_2\cot\left(\frac{\theta_2}{2}\right)\right]\frac{-\cos\left(\frac{\theta_2}{2}+\theta'_2\right)\sin\left(\frac{\theta_2}{2}\right)}{\cos(\theta'_2)} + L_2$$

The adjustment range of the distance $d_2$ between the conical tip of said second convex axicon and said second movable mirror should satisfy the following equation:

$$\frac{\frac{D}{2}-\frac{D}{2}b_2}{a_2} \le d_2 \le \frac{\frac{D_2}{2}-\frac{D}{2}b_2}{a_2}$$

Adjust said second movable mirror, so that the distance between the conical tip of said second convex axicon and said second movable mirror equals $d_2$.

⑤ According to the required inner and outer diameters of outer ring, determine the distance $d_1$ between the conical tip of said first convex axicon and said first movable mirror by the following equation:

$$D_{1i}/2 = \left[d_1 + L_1\cot\left(\frac{\theta_1}{2}\right)\right]\frac{-\cos\left(\frac{\theta_1}{2} + \theta_1'\right)\sin\left(\frac{\theta_1}{2}\right)}{\cos(\theta_1')} + L_1$$

The adjustment range of the distance $d_1$ between the conical tip of said first convex axicon and said first movable mirror should satisfy the following equation:

$$\frac{\frac{D}{2} - \frac{D}{2}b_1}{a_1} \le d_1 \le \frac{\frac{D_1}{2} - \frac{D}{2}b_1}{a_1}$$

Adjust said first movable mirror, so that the distance between the conical tip of said first convex axicon and said first movable mirror equals $d_1$.

3. For the 45° incidence angle of the beam incident on said polarization splitting film, the reflectivity and transmittance of polarized light p are close to 100% and 0, the transmittance and reflectivity of polarized light s are close to 100% and 0. The outer diameter of said first single ring beam is less than the inner diameter of said second single ring beam:

① According to the required double ring illumination mode, select corresponding said diffractive optical element;

② According to the required ring width w of the double ring illumination mode, determine the focal length f' of said zoom collimating lens group by the follow equation:

$$2w=D=2f'\sin U'$$

Adjust the position(s) of the movable lens(es) of said zoom collimating lens group, so that its focal length equals f'.

③ According to the required energy distribution relationship $(A'_p{}^2:A'_s{}^2)$ of inner and outer rings, determine the angle $\theta_0$ between the fast axis of said rotatable wave plate and x-axis by the following equation:

$$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix}\begin{pmatrix} A_s \\ A_p \end{pmatrix}$$

Adjust said rotatable wave plate, so that the angle between the fast axis of said rotatable wave plate and x-axis equals $\theta_0$.

④ According to the required inner and outer diameters of inner ring, determine the distance $d_1$ between the conical tip of said first convex axicon and said first movable mirror by the following equation:

$$D_{1i}/2 = \left[d_1 + L_1\cot\left(\frac{\theta_1}{2}\right)\right]\frac{-\cos\left(\frac{\theta_1}{2} + \theta_1'\right)\sin\left(\frac{\theta_1}{2}\right)}{\cos(\theta_1')} + L_1$$

The adjustment range of the distance $d_1$ between the conical tip of said first convex axicon and said first movable mirror should satisfy the following equation:

$$\frac{\frac{D}{2} - \frac{D}{2}b_1}{a_1} \le d_1 \le \frac{\frac{D_1}{2} - \frac{D}{2}b_1}{a_1}$$

Adjust said first movable mirror, so that the distance between the conical tip of said first convex axicon and said first movable mirror equals $d_1$.

⑤ According to the required inner and outer diameters of outer ring, determine the distance $d_2$ between the conical tip of said second convex axicon and said second movable mirror by the following equation:

$$D_{2i}/2 = \left[d_2 + L_2\cot\left(\frac{\theta_2}{2}\right)\right]\frac{-\cos\left(\frac{\theta_2}{2} + \theta_2'\right)\sin\left(\frac{\theta_2}{2}\right)}{\cos(\theta_2')} + L_2$$

The adjustment range of the distance $d_2$ between the conical tip of said second convex axicon and said second movable mirror should satisfy the following equation:

$$\frac{\frac{D}{2} - \frac{D}{2}b_2}{a_2} \le d_2 \le \frac{\frac{D_2}{2} - \frac{D}{2}b_2}{a_2}$$

Adjust said second movable mirror, so that the distance between the conical tip of said second convex axicon and said second movable mirror equals $d_2$.

4. For the 45° incidence angle of the beam incident on said polarization splitting film, the reflectivity and transmittance of polarized light p are close to 100% and 0, the transmittance and reflectivity of polarized light s are close to 100% and 0. The inner diameter of said first single ring beam is greater than the outer diameter of said second single ring beam:

① According to the required double ring illumination mode, select corresponding said diffractive optical element;

② According to the required ring width w of the double ring illumination mode, determine the focal length f' of said zoom collimating lens group by the follow equation:

$$2w=D=2f'\sin U'$$

Adjust the position(s) of the movable lens(es) of said zoom collimating lens group, so that its focal length equals f'.

③ According to the required energy distribution relationship $(A'_p{}^2:A'_s{}^2)$ of inner and outer rings, determine the angle $\theta_0$ between the fast axis of said rotatable wave plate and x-axis by the following equation:

$$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix}\begin{pmatrix} A_s \\ A_p \end{pmatrix}$$

Adjust said rotatable wave plate, so that the angle between the fast axis of said rotatable wave plate and x-axis equals $\theta_0$.

④ According to the required inner and outer diameters of inner ring, determine the distance $d_2$ between the conical tip of said second convex axicon and said second movable mirror by the following equation:

$$D_{2i}/2 = \left[d_2 + L_2\cot\left(\frac{\theta_2}{2}\right)\right]\frac{-\cos\left(\frac{\theta_2}{2} + \theta_2'\right)\sin\left(\frac{\theta_2}{2}\right)}{\cos(\theta_2')} + L_2$$

The adjustment range of the distance $d_2$ between the conical tip of said second convex axicon and said second movable mirror should satisfy the following equation:

$$\frac{\frac{D}{2}-\frac{D}{2}b_2}{a_2} \le d_2 \le \frac{\frac{D_2}{2}-\frac{D}{2}b_2}{a_2}$$

Adjust said second movable mirror, so that the distance between the conical tip of said second convex axicon and said second movable mirror equals $d_2$.

⑤ According to the required inner and outer diameters of outer ring, determine the distance $d_1$ between the conical tip of said first convex axicon and said first movable mirror by the following equation:

$$D_{1i}/2 = \left[d_1 + L_1\cot\left(\frac{\theta_1}{2}\right)\right]\frac{-\cos\left(\frac{\theta_1}{2}+\theta_1'\right)\sin\left(\frac{\theta_1}{2}\right)}{\cos(\theta_1')} + L_1$$

The adjustment range of the distance $d_1$ between the conical tip of said first convex axicon and said first movable mirror should satisfy the following equation:

$$\frac{\frac{D}{2}-\frac{D}{2}b_1}{a_1} \le d_1 \le \frac{\frac{D_1}{2}-\frac{D}{2}b_1}{a_1}$$

Adjust said first movable mirror, so that the distance between the conical tip of said first convex axicon and said first movable mirror equals $d_1$.

The method for generating off-axis single ring illumination mode using this invention contains the following implement methods:

1. For the 45° incidence angle of the beam incident on said polarization splitting film, the reflectivity and transmittance of polarized light s are close to 100% and 0, the transmittance and reflectivity of polarized light p are close to 100% and 0. The outer diameter of said first single ring beam is greater than or equal to the inner diameter of said second single ring beam and less than or equal to the outer diameter of said second single ring beam:

① According to the required single ring illumination mode, select corresponding said diffractive optical element;

② According to the required ring width w' of the single ring illumination mode, determine the ring widths w of said first single ring beam and said second single ring beam, the inner and outer diameters of said first single ring beam and the inner and outer diameters of said second single ring beam. The ring widths w of said first single ring beam and said second single ring beam should satisfy the following equation:

w≤w'≤2w

And determine the focal length f' of said zoom collimating lens group by the follow equation:

2w=D=2f' sin U'

With the determined inner and outer diameters of said first single ring beam and said second single ring beam, determine the distance $d_1$ between the conical tip of said first convex axicon and said first movable mirror, and the distance $d_2$ between the conical tip of said second convex axicon and said second movable mirror.

The distance $d_1$ between the conical tip of said first convex axicon and said first movable mirror is determined by the following equation:

$$D_{1i}/2 = \left[d_1 + L_1\cot\left(\frac{\theta_1}{2}\right)\right]\frac{-\cos\left(\frac{\theta_1}{2}+\theta_1'\right)\sin\left(\frac{\theta_1}{2}\right)}{\cos(\theta_1')} + L_1$$

The adjustment range of the distance $d_1$ between the conical tip of said first convex axicon and said first movable mirror should satisfy the following equation:

$$\frac{\frac{D}{2}-\frac{D}{2}b_1}{a_1} \le d_1 \le \frac{\frac{D_1}{2}-\frac{D}{2}b_1}{a_1}$$

The distance $d_2$ between the conical tip of said second convex axicon and said second movable mirror is determined by the following equation:

$$D_{2i}/2 = \left[d_2 + L_2\cot\left(\frac{\theta_2}{2}\right)\right]\frac{-\cos\left(\frac{\theta_2}{2}+\theta_2'\right)\sin\left(\frac{\theta_2}{2}\right)}{\cos(\theta_2')} + L_2$$

The adjustment range of the distance $d_2$ between the conical tip of said second convex axicon and said second movable mirror should satisfy the following equation:

$$\frac{\frac{D}{2}-\frac{D}{2}b_2}{a_2} \le d_2 \le \frac{\frac{D_2}{2}-\frac{D}{2}b_2}{a_2}$$

Adjust the position(s) of the movable lens(es) of said zoom collimating lens group, so that its focal length equals f'.

Adjust said first movable mirror, so that the distance between the conical tip of said first convex axicon and said first movable mirror equals $d_1$.

Adjust said second movable mirror, so that the distance between the conical tip of said second convex axicon and said second movable mirror equals $d_2$.

③ According to the required energy distribution relationship of single ring illumination mode, determine the angle $\theta_0$ between the fast axis of said rotatable wave plate and x-axis by the following equation:

$$\begin{pmatrix} A_s' \\ A_p' \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

Adjust said rotatable wave plate, so that the angle between the fast axis of said rotatable wave plate and x-axis equals $\theta_0$.

2. For the 45° incidence angle of the beam incident on said polarization splitting film, the reflectivity and transmittance of polarized light s are close to 100 and 0, the transmittance and reflectivity of polarized light p are close to 100% and 0. The outer diameter of said second single ring beam is less than the outer diameter of said first single ring beam and greater than or equal to the inner diameter of said first single ring beam:

① According to the required single ring illumination mode, select corresponding said diffractive optical element;

② According to the required ring width w' of the single ring illumination mode, determine the ring widths w of said first single ring beam and said second single ring beam, the inner and outer diameters of said first single ring beam and the inner and outer diameters of said second single ring beam. The ring widths w of said first single ring beam and said second single ring beam should satisfy the following equation:

$$w \le w' \le 2w$$

And determine the focal length f' of said zoom collimating lens group by the follow equation:

$$2w=D=2f' \sin U'$$

With the determined inner and outer diameters of said first single ring beam and said second single ring beam, determine the distance $d_1$ between the conical tip of said first convex axicon and said first movable mirror, and the distance $d_2$ between the conical tip of said second convex axicon and said second movable mirror.

The distance $d_1$ between the conical tip of said first convex axicon and said first movable mirror is determined by the following equation:

$$D_{1i}/2 = \left[d_1 + L_1 \cot\left(\frac{\theta_1}{2}\right)\right] \frac{-\cos\left(\frac{\theta_1}{2} + \theta_1'\right)\sin\left(\frac{\theta_1}{2}\right)}{\cos(\theta_1')} + L_1$$

The adjustment range of the distance $d_1$ between the conical tip of said first convex axicon and said first movable mirror should satisfy the following equation:

$$\frac{\frac{D}{2} - \frac{D}{2}b_1}{a_1} \le d_1 \le \frac{\frac{D_1}{2} - \frac{D}{2}b_1}{a_1}$$

The distance $d_2$ between the conical tip of said second convex axicon and said second movable mirror is determined by the following equation:

$$D_{2i}/2 = \left[d_2 + L_2 \cot\left(\frac{\theta_2}{2}\right)\right] \frac{-\cos\left(\frac{\theta_2}{2} + \theta_2'\right)\sin\left(\frac{\theta_2}{2}\right)}{\cos(\theta_2')} + L_2$$

The adjustment range of the distance $d_2$ between the conical tip of said second convex axicon and said second movable mirror should satisfy the following equation:

$$\frac{\frac{D}{2} - \frac{D}{2}b_2}{a_2} \le d_2 \le \frac{\frac{D_2}{2} - \frac{D}{2}b_2}{a_2}$$

Adjust the position(s) of the movable lens(es) of said zoom collimating lens group, so that its focal length equals f'.

Adjust said first movable mirror, so that the distance between the conical tip of said first convex axicon and said first movable mirror equals $d_1$.

Adjust said second movable mirror, so that the distance between the conical tip of said second convex axicon and said second movable mirror equals $d_2$.

③ According to the required energy distribution relationship of single ring illumination mode, determine the angle $\theta_0$ between the fast axis of said rotatable wave plate and x-axis by the following equation:

$$\begin{pmatrix} A_s' \\ A_p' \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

Adjust said rotatable wave plate, so that the angle between the fast axis of said rotatable wave plate and x-axis equals $\theta_0$.

3. For the 45° incidence angle of the beam incident on said polarization splitting film, the reflectivity and transmittance of polarized light p are close to 100% and 0, the transmittance and reflectivity of polarized light s are close to 100% and 0. The outer diameter of said first single ring beam is greater than or equal to the inner diameter of said second single ring beam and less than or equal to the outer diameter of said second single ring beam:

① According to the required single ring illumination mode, select corresponding said diffractive optical element;

② According to the required ring width w' of the single ring illumination mode, determine the ring widths w of said first single ring beam and said second single ring beam, the inner and outer diameters of said first single ring beam and the inner and outer diameters of said second single ring beam. The ring widths w of said first single ring beam and said second single ring beam should satisfy the following equation:

$$w \le w' \le 2w$$

And determine the focal length f' of said zoom collimating lens group by the follow equation:

$$2w=D=2f' \sin U'$$

With the determined inner and outer diameters of said first single ring beam and said second single ring beam, determine the distance $d_1$ between the conical tip of said first convex axicon and said first movable mirror, and the distance $d_2$ between the conical tip of said second convex axicon and said second movable mirror.

The distance $d_1$ between the conical tip of said first convex axicon and said first movable mirror is determined by the following equation:

$$D_{1i}/2 = \left[d_1 + L_1 \cot\left(\frac{\theta_1}{2}\right)\right] \frac{-\cos\left(\frac{\theta_1}{2} + \theta_1'\right)\sin\left(\frac{\theta_1}{2}\right)}{\cos(\theta_1')} + L_1$$

The adjustment range of the distance $d_1$ between the conical tip of said first convex axicon and said first movable mirror should satisfy the following equation:

$$\frac{\frac{D}{2} - \frac{D}{2}b_1}{a_1} \le d_1 \le \frac{\frac{D_1}{2} - \frac{D}{2}b_1}{a_1}$$

The distance $d_2$ between the conical tip of said second convex axicon and said second movable mirror is determined by the following equation:

$$D_{2i}/2 = \left[d_2 + L_2 \cot\left(\frac{\theta_2}{2}\right)\right] \frac{-\cos\left(\frac{\theta_2}{2} + \theta_2'\right)\sin\left(\frac{\theta_2}{2}\right)}{\cos(\theta_2')} + L_2$$

The adjustment range of the distance $d_2$ between the conical tip of said second convex axicon and said second movable mirror should satisfy the following equation:

$$\frac{\frac{D}{2}-\frac{D}{2}b_2}{a_2} \le d_2 \le \frac{\frac{D_2}{2}-\frac{D}{2}b_2}{a_2}$$

Adjust the position(s) of the movable lens(es) of said zoom collimating lens group, so that its focal length equals f'.

Adjust said first movable mirror, so that the distance between the conical tip of said first convex axicon and said first movable mirror equals $d_1$.

Adjust said second movable mirror, so that the distance between the conical tip of said second convex axicon and said second movable mirror equals $d_2$.

③ According to the required energy distribution relationship of single ring illumination mode, determine the angle $\theta_0$ between the fast axis of said rotatable wave plate and x-axis by the following equation:

$$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

Adjust said rotatable wave plate, so that the angle between the fast axis of said rotatable wave plate and x-axis equals $\theta_0$.

4. For the 45° incidence angle of the beam incident on said polarization splitting film, the reflectivity and transmittance of polarized light p are close to 100% and 0, the transmittance and reflectivity of polarized light s are close to 100% and 0. The outer diameter of said second single ring beam is less than the outer diameter of said first single ring beam and greater than or equal to the inner diameter of said first single ring beam:

① According to the required single ring illumination mode, select corresponding said diffractive optical element;

② According to the required ring width w' of the single ring illumination mode, determine the ring widths w of said first single ring beam and said second single ring beam, the inner and outer diameters of said first single ring beam and the inner and outer diameters of said second single ring beam. The ring widths w of said first single ring beam and said second single ring beam should satisfy the following equation:

w≤w'≤2w

And determine the focal length f' of said zoom collimating lens group by the follow equation:

2w=D=2f' sin U'

With the determined inner and outer diameters of said first single ring beam and said second single ring beam, determine the distance $d_1$ between the conical tip of said first convex axicon and said first movable mirror, and the distance $d_2$ between the conical tip of said second convex axicon and said second movable mirror.

The distance $d_1$ between the conical tip of said first convex axicon and said first movable mirror is determined by the following equation:

$$D_{1i}/2 = \left[d_1 + L_1\cot\left(\frac{\theta_1}{2}\right)\right]\frac{-\cos\left(\frac{\theta_1}{2}+\theta'_1\right)\sin\left(\frac{\theta_1}{2}\right)}{\cos(\theta'_1)} + L_1$$

The adjustment range of the distance $d_1$ between the conical tip of said first convex axicon and said first movable mirror should satisfy the following equation:

$$\frac{\frac{D}{2}-\frac{D}{2}b_1}{a_1} \le d_1 \le \frac{\frac{D_1}{2}-\frac{D}{2}b_1}{a_1}$$

The distance $d_2$ between the conical tip of said second convex axicon and said second movable mirror is determined by the following equation:

$$D_{2i}/2 = \left[d_2 + L_2\cot\left(\frac{\theta_2}{2}\right)\right]\frac{-\cos\left(\frac{\theta_2}{2}+\theta'_2\right)\sin\left(\frac{\theta_2}{2}\right)}{\cos(\theta'_2)} + L_2$$

The adjustment range of the distance $d_2$ between the conical tip of said second convex axicon and said second movable mirror should satisfy the following equation:

$$\frac{\frac{D}{2}-\frac{D}{2}b_2}{a_2} \le d_2 \le \frac{\frac{D_2}{2}-\frac{D}{2}b_2}{a_2}$$

Adjust the position(s) of the movable lens(es) of said zoom collimating lens group, so that its focal length equals f'.

Adjust said first movable mirror, so that the distance between the conical tip of said first convex axicon and said first movable mirror equals $d_1$.

Adjust said second movable mirror, so that the distance between the conical tip of said second convex axicon and said second movable mirror equals $d_2$.

③ According to the required energy distribution relationship of single ring illumination mode, determine the angle $\theta_0$ between the fast axis of said rotatable wave plate and x-axis by the following equation:

$$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix}$$

Adjust said rotatable wave plate, so that the angle between the fast axis of said rotatable wave plate and x-axis equals $\theta_0$.

Comparing with the previous technologies, the technical advantages of this invention contains:

1. This invention lithography pupil shaping optical system, can achieve single ring illumination mode and double ring illumination mode.

2. In the achieved illumination mode of this invention, the conversion of corresponding single ring illumination mode and double ring illumination mode does not need to exchange the diffractive optical element; just adjust the distance between the conical tip of convex axicon and the movable mirror.

3. The inner and outer diameters of the achieved illumination mode can be adjusted continuously, and there is no interaction between the adjustments.

4. The inner and outer rings energy distribution ratio of the achieved illumination mode can be adjusted continuously.

BRIEF DESCRIPTION OF THE DRAWINGS

The invention description below refers to the accompanying drawings, of which.

DETAILED DESCRIPTION OF AN ILLUSTRATIVE EMBODIMENT

Additional descriptions of the invention are presented combining with the drawings and embodiment. These descriptions are not the limitation of the protection range for the invention.

Figure 1:
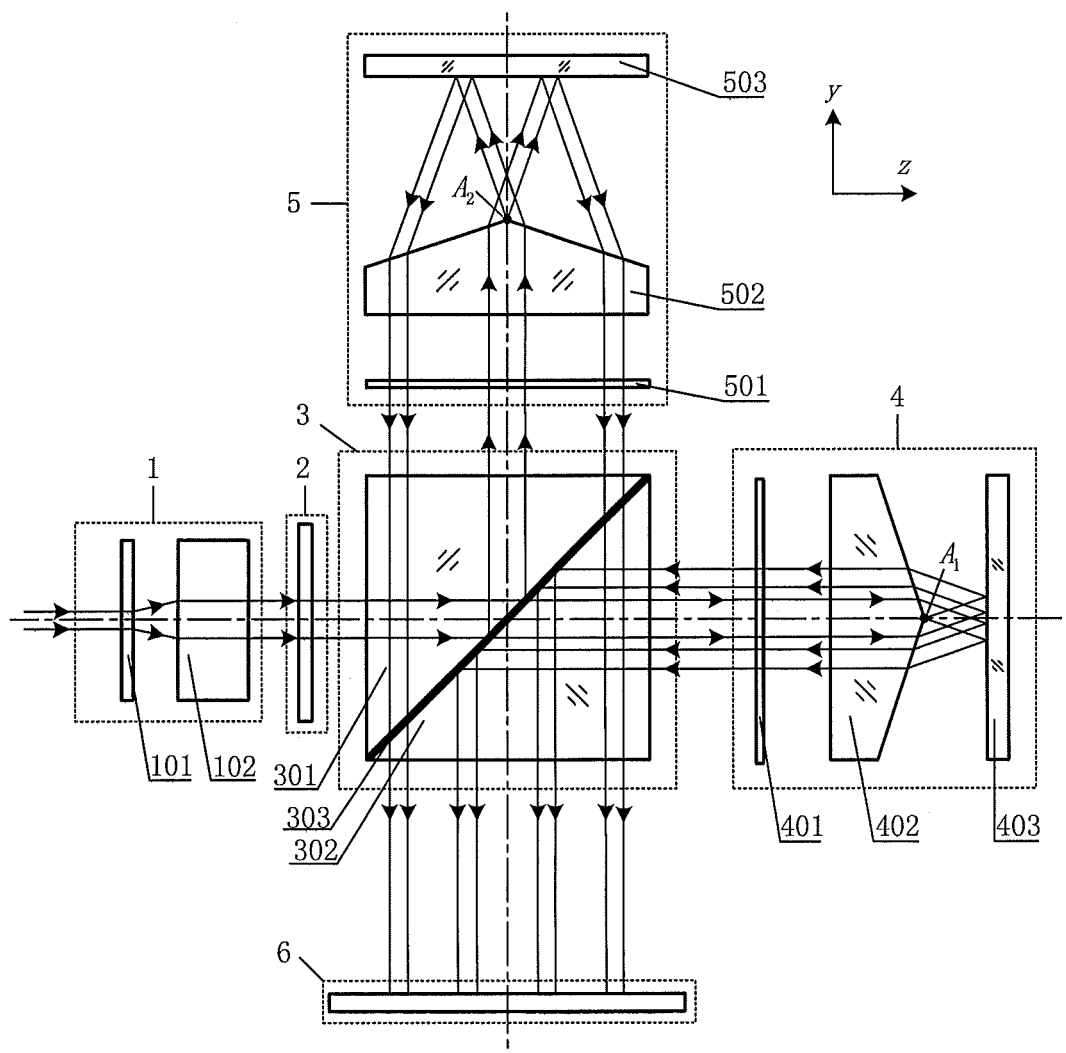
FIG. 1 illustrates the optical schematic of the lithography pupil shaping optical system.

In FIG. 1, the lithography pupil shaping optical system is composed of illumination mode generation unit 1, rotatable wave plate 2, polarization beam splitter unit 3, ring I generation unit 4 and ring II generation unit 5.

Said illumination mode generation unit 1 is composed of diffractive optical element 101 and zoom collimating lens group 102. Diffractive optical element 101 is exchangeable to achieve illumination modes including conventional, dipole, quadrupole, etc.

Said polarization beam splitter unit 3 is composed of first isosceles right-angle prism 301, second isosceles right-angle prism 302 and polarization splitting film 303. The bevel edges of first isosceles right-angle prism 301 and second isosceles right-angle prism 302 are placed oppositely to form a cube prism. The polarization splitting film 303 is sandwiched between the bevel edges of first isosceles right-angle prism 301 and second isosceles right-angle prism 302.

Said ring I generation unit 4 is composed of first quarter-wave plate 401, first convex axicon 402 and first movable mirror 403. Said first movable mirror possesses mechanical structures by which the distance between the conical tip of said first convex axicon and said first movable mirror can be adjusted continuously;

Said ring II generation unit 5 is composed of second quarter-wave plate 501, second as convex axicon 502 and second movable mirror 503. Said second movable mirror possesses mechanical structures by which the distance between the conical tip of said second convex axicon and said second movable mirror can be adjusted continuously;

The positions of the above components are as follows: Along the positive direction of z-axis, diffractive optical element 101, zoom collimating lens group 102, rotatable wave plate 2, polarization beam splitter unit 3, first quarter-wave plate 401, first convex axicon 402 and first movable mirror 403 are placed sequentially. Along the reflected light direction of polarization beam splitter unit 3, the second quarter-wave plate 501, second convex axicon 502 and second movable mirror 503 are placed sequentially.

The rear surface of said diffractive optical element 101 is placed at the front focal plane of said zoom collimating lens group 102. The beam incident on said diffractive optical element 101 could be square linearly polarized beam. And the beam emitting from said diffractive optical element 101 is single ring beam. Then the single ring beam is collimated by said zoom collimating lens group 102. Moreover, the size of the single ring beam could be adjusted continuously for continuous adjustment of the focal length of said zoom collimating lens group 102. And the size of the single ring beam is expressed by $$D = 2f' \sin U' \quad (1)$$

where, D is the diameter of the collimated beam emitted from said illumination mode generation unit 1, U' is the half diffractive angle of said diffractive optical element 101, f' is the focal length of said zoom collimating lens group 102.

The relationship of the polarized light p and s emitted from said rotatable wave plate 2 to the polarized light p and s incident on said rotatable wave 2 plate is expressed by $$\begin{pmatrix} A'_s \\ A'_p \end{pmatrix} = \begin{pmatrix} \cos^2\theta_0 + e^{i\delta}\sin^2\theta_0 & \cos\theta_0\sin\theta_0 - e^{i\delta}\cos\theta_0\sin\theta_0 \\ \cos\theta_0\sin\theta_0 - e^{i\delta}\cos\theta_0\sin\theta_0 & \sin^2\theta_0 + e^{i\delta}\cos^2\theta_0 \end{pmatrix} \begin{pmatrix} A_s \\ A_p \end{pmatrix} \quad (2)$$

where, $A_s$ and $A_p$ are the components along x-axis and y-axis of the linearly polarized beam incident on said rotatable wave plate 2, $\delta$ is the phase delay difference of the fast and slow axis of said rotatable wave plate 2, $\theta_0$ is the angle between the fast axis of said rotatable wave plate 2 and x-axis, $A'_s$ and $A'_p$ are the components along x-axis and y-axis of the linearly polarized beam emitted from said rotatable wave plate 2.

The energy ratio of polarized light p to s emitted from said rotatable wave plate 2 is about $A'^2_p : A'^2_s$.

Said rotatable wave plate 2 can adjust the angle $\theta_0$ between its fast axis and x-axis continuously.

The light emitted from said rotatable wave plate 2 is incident onto said polarization splitting film 303 with 45° incidence angle after it passing through said first isosceles right-angle prism 301.

Said polarization beam splitter unit 3 achieves one of the following functions:

①For the 45° incidence angle of the beam incident on said polarization splitting film 303, the reflectivity and transmittance of polarized light s are close to 100% and 0, the transmittance and reflectivity of polarized light p are close to 100% and 0.

②For the 45° incidence angle of the beam incident on said polarization splitting film 303, the reflectivity and transmittance of polarized light p are close to 100% and 0, the transmittance and reflectivity of polarized light s are close to 100% and 0.

The polarized light s and p emitted from said rotatable wave plate 2 is separated by said polarization beam splitter unit 3. One of them is transmitted completely, the other one is reflected completely. The transmitted portion is incident onto said ring I generation unit 4. The reflected portion is incident onto said ring II generation unit 5.

The angle between the fast axis of said first quarter-wave plate 401 and the positive direction of x-axis could be 45°, −45°, 135° or −135°.

The conical tip of said first convex axicon 402 is faced with said first movable mirror 403.

Said first movable mirror 403 is coated with polarization-maintaining reflection film. Said first movable mirror 403 is mounted on a one-dimensional guideway with which the distance between the conical tip of said first convex axicon 402 and said first movable mirror 403 could be adjusted continuously.

Said ring I generation unit 4 transforms the light incident on it into first single ring beam. The emitting direction of first single ring beam is opposite to the direction of light incident on said ring I generation unit 4. The first single ring beam is incident onto said polarization beam splitter unit 3 again, and then it is reflected by said polarization beam splitter unit 3 into the pupil plane 6.

The inner diameter $D_{1i}$ of said first single ring beam is calculated by $$D_{1i}/2 = \left[d_1 + L_1 \cot\left(\frac{\theta_1}{2}\right)\right] \frac{-\cos\left(\frac{\theta_1}{2} + \theta'_1\right) \sin\left(\frac{\theta_1}{2}\right)}{\cos(\theta'_1)} + L_1 \quad (3)$$

where, $$L_1 = -\left[d_1 + \frac{D}{2}\cot\left(\frac{\theta_1}{2}\right)\right]\cot\left(\frac{\theta_1}{2} + \theta'_1\right) - \frac{D}{2}$$

with $$\theta'_1 = \arcsin\left(n_1 \cos\left(\frac{\theta_1}{2}\right)\right),$$

$n_1$, $\theta_1$ is the index of refraction and the cone angle of said first convex axicon 402, $d_1$ is the distance between the conical tip of said first convex axicon 402 and said first movable mirror 403. The cone angle $\theta_1$ of said first convex axicon 402 is the angle between the two bevel edges of said first convex axicon 402.

The width w of said first single ring beam is calculated by the equation $$w = D/2 \quad (4)$$

The outer diameter $D_{1o}$ of said first single ring beam is calculated by the equation $$D_{1o} = D_{1i} + D \quad (5)$$

The variation ranges of the inner diameter $D_{1i}$ and outer diameter $D_{1o}$ of said first single ring beam are determined by the adjustment range of $d_1$:

$$\frac{\frac{D}{2} - \frac{D}{2}b_1}{a_1} \leq d_1 \leq \frac{\frac{D_1}{2} - \frac{D}{2}b_1}{a_1} \quad (6)$$

where, $D_1$ is the conical bottom diameter of said first convex axicon 402, the conical bottom diameter $D_1$ of said first convex axicon 402 is the bottom width in the right view when the conical tip $A_1$ of said first convex axicon 402 is placed vertically up, $a_1$ and $b_1$ is calculated by the following equations:

$$a_1 = -\cos\left(\frac{\theta_1}{2} + \theta'_1\right)\left\{\left[1 - \cot\left(\frac{\theta_1}{2} + \theta'_1\right)\cot\left(\frac{\theta_1}{2}\right)\right]\frac{\sin\left(\frac{\theta_1}{2}\right)}{\cos(\theta'_1)} + 1\right\}$$

$$b_1 = \cot\left(\frac{\theta_1}{2}\right)\cos\left(\frac{\theta_1}{2} + \theta'_1\right)\left\{\left[1 + \cot\left(\frac{\theta_1}{2}\right)\cot\left(\frac{\theta_1}{2} + \theta'_1\right)\right]\frac{\sin\left(\frac{\theta_1}{2}\right)}{\cos(\theta'_1)} - 1\right\}$$

The angle between the fast axis of said second quarter-wave plate 501 and the positive direction of x-axis could be 45°, −45°, 135° or −135°.

The conical tip $A_2$ of said second convex axicon 502 is faced with said second movable mirror 503.

Said second movable mirror 503 is coated with polarization-maintaining reflection film. Said second movable mirror 503 is mounted on a one-dimensional guideway with which the distance between the conical tip $A_2$ of said second convex axicon 502 and said second movable mirror 503 can be adjusted continuously.

Said ring II generation unit 5 transforms the light incident on it into second single ring beam. The emitting direction of second single ring beam is opposite to the direction of light incident on said ring II generation unit 5. The second single ring beam is incident onto said polarization beam splitter unit 3 again, and then it is transmitted by said polarization beam splitter unit 3 into the pupil plane 6.

The inner diameter $D_{2i}$ of said second single ring beam is calculated by $$D_{2i}/2 = \left[d_2 + L_2 \cot\left(\frac{\theta_2}{2}\right)\right] \frac{-\cos\left(\frac{\theta_2}{2} + \theta'_2\right) \sin\left(\frac{\theta_2}{2}\right)}{\cos(\theta'_2)} + L_2 \quad (7)$$

where, $$L_2 = -\left[d_2 + \frac{D}{2}\cot\left(\frac{\theta_2}{2}\right)\right]\cot\left(\frac{\theta_2}{2} + \theta'_2\right) - \frac{D}{2}$$

with $$\theta'_2 = \arcsin\left(n_2 \cos\left(\frac{\theta_2}{2}\right)\right),$$

$n_2$, $\theta_2$ is the index of refraction and the cone angle of said second convex axicon 502, $d_2$ is the distance between the conical tip $A_2$ of said second convex axicon 502 and said second movable mirror 503. The cone angle $\theta_2$ of said second convex axicon 502 is the angle between the two bevel edges of said second convex axicon 502.

The width w of said second single ring beam is calculated by the equation $$w = D/2 \quad (8)$$

The outer diameter $D_{2o}$ of said second single ring beam is calculated by the equation $$D_{2o} = D_{2i} + D \quad (9)$$

The variation ranges of the inner diameter $D_{2i}$ and outer diameter $D_{2o}$ of said second single ring beam are determined by the adjustment range of $d_2$:

$$\frac{\frac{D}{2} - \frac{D}{2}b_2}{a_2} \le d_2 \le \frac{\frac{D_2}{2} - \frac{D}{2}b_2}{a_2} \quad (10)$$

where, $D_2$ is the conical bottom diameter of said second convex axicon 502, the conical bottom diameter $D_2$ of said second convex axicon 502 is the bottom width of said second convex axicon 502, $a_2$ and $b_2$ is calculated by the following equations:

$$a_2 = -\cos\left(\frac{\theta_2}{2} + \theta_2'\right)\left\{\left[1 - \cot\left(\frac{\theta_2}{2} + \theta_2'\right)\cot\left(\frac{\theta_2}{2}\right)\right]\frac{\sin\left(\frac{\theta_2}{2}\right)}{\cos(\theta_2')} + 1\right\}$$

$$b_2 = \cot\left(\frac{\theta_2}{2}\right)\cos\left(\frac{\theta_2}{2} + \theta_2'\right)\left\{\left[1 + \cot\left(\frac{\theta_2}{2}\right)\cot\left(\frac{\theta_2}{2} + \theta_2'\right)\right]\frac{\sin\left(\frac{\theta_2}{2}\right)}{\cos(\theta_2')} - 1\right\}$$

The method for generating off-axis double ring illumination mode contains the following implement methods:

1. For the 45° incidence angle of the beam incident on said polarization splitting film 303, the reflectivity and transmittance of polarized light s are close to 100% and 0, the transmittance and reflectivity of polarized light p are close to 100% and 0. The outer diameter of said first single ring beam is less than the inner diameter of said second single ring beam:

① According to the required double ring illumination mode, select corresponding said diffractive optical element 101;

② According to the required ring width w of the double ring illumination mode, determine the focal length f' of said zoom collimating lens group 102 by equations (1) and (4). Adjust the position(s) of the movable lens(es) of said zoom collimating lens group 102, so that its focal length equals f'.

③ According to the required energy distribution relationship $(A'_p{}^2:A'_s{}^2)$ of inner and outer rings, determine the angle $\theta_0$ between the fast axis of said rotatable wave plate 2 and x-axis by equation (2). Adjust said rotatable wave plate 2, so that the angle between the fast axis of said rotatable wave plate 2 and x-axis equals $\theta_0$.

④ According to the required inner and outer diameters of inner ring, determine the distance $d_1$ between the conical tip of said first convex axicon 402 and said first movable mirror 403 by equation (3). The adjustment range of the distance $d_1$ between the conical tip of said first convex axicon 402 and said first movable mirror 403 should satisfy equation (6). Adjust said first movable mirror 403, so that the distance between the conical tip of said first convex axicon 402 and said first movable mirror 403 equals $d_1$.

⑤ According to the required inner and outer diameters of outer ring, determine the distance $d_2$ between the conical tip of said second convex axicon 502 and said second movable mirror 503 by equation (7). The adjustment range of the distance $d_2$ between the conical tip of said second convex axicon 502 and said second movable mirror 503 should satisfy equation (10). Adjust said second movable mirror 503, so that the distance between the conical tip of said second convex axicon 502 and said second movable mirror 503 equals $d_2$.

2. For the 45° incidence angle of the beam incident on said polarization splitting film 303, the reflectivity and transmittance of polarized light s are close to 100% and 0, the transmittance and reflectivity of polarized light p are close to 100% and 0. The inner diameter of said first single ring beam is greater than the outer diameter of said second single ring beam:

① According to the required double ring illumination mode, select corresponding said diffractive optical element 101;

② According to the required ring width w of the double ring illumination mode, determine the focal length f' of said zoom collimating lens group 102 by equations (1) and (4). Adjust the position(s) of the movable lens(es) of said zoom collimating lens group 102, so that its focal length equals f'.

③ According to the required energy distribution relationship $(A'_p{}^2:A'_s{}^2)$ of inner and outer rings, determine the angle $\theta_0$ between the fast axis of said rotatable wave plate 2 and x-axis by equation (2). Adjust said rotatable wave plate 2, so that the angle between the fast axis of said rotatable wave plate 2 and x-axis equals $\theta_0$.

④ According to the required inner and outer diameters of inner ring, determine the distance $d_2$ between the conical tip of said second convex axicon 502 and said second movable mirror 503 by equation (7). The adjustment range of the distance $d_2$ between the conical tip of said second convex axicon 502 and said second movable mirror 503 should satisfy equation (10). Adjust said second movable mirror 503, so that the distance between the conical tip of said second convex axicon 502 and said second movable mirror 503 equals $d_2$.

⑤ According to the required inner and outer diameters of outer ring, determine the distance $d_1$ between the conical tip of said first convex axicon 402 and said first movable mirror 403 by equation (3). The adjustment range of the distance $d_1$ between the conical tip of said first convex axicon 402 and said first movable mirror 403 should satisfy equation (6). Adjust said first movable mirror 403, so that the distance between the conical tip of said first convex axicon 402 and said first movable mirror 403 equals $d_1$.

3. For the 45° incidence angle of the beam incident on said polarization splitting film 303, the reflectivity and transmittance of polarized light p are close to 100% and 0, the transmittance and reflectivity of polarized light s are close to 100 and 0. The outer diameter of said first single ring beam is less than the inner diameter of said second single ring beam:

① According to the required double ring illumination mode, select corresponding said diffractive optical element 101;

② According to the required ring width w of the double ring illumination mode, determine the focal length f' of said zoom collimating lens group 102 by equations (1) and (4). Adjust the position(s) of the movable lens(es) of said zoom collimating lens group 102, so that its focal length equals f'.

③ According to the required energy distribution relationship $(A'_p{}^2:A'_s{}^2)$ of inner and outer rings, determine the angle $\theta_0$ between the fast axis of said rotatable wave plate 2 and x-axis by equation (2). Adjust said rotatable wave plate 2, so that the angle between the fast axis of said rotatable wave plate 2 and x-axis equals $\theta_0$.

④ According to the required inner and outer diameters of inner ring, determine the distance $d_1$ between the conical tip of said first convex axicon 402 and said first movable mirror 403 by equation (3). The adjustment range of the distance $d_1$ between the conical tip of said first convex axicon 402 and said first movable mirror 403 should satisfy equation (6). Adjust said first movable mirror 403, so that the distance between the conical tip of said first convex axicon 402 and said first movable mirror 403 equals $d_1$.

⑤ According to the required inner and outer diameters of outer ring, determine the distance $d_2$ between the conical tip of said second convex axicon 502 and said second movable mirror 503 by equation (7). The adjustment range of the distance $d_2$ between the conical tip of said second convex axicon 502 and said second movable mirror 503 should satisfy equation (10). Adjust said second movable mirror 503, so that the distance between the conical tip of said second convex axicon 502 and said second movable mirror 503 equals $d_2$.

4. For the 45° incidence angle of the beam incident on said polarization splitting film 303, the reflectivity and transmittance of polarized light p are close to 100% and 0, the transmittance and reflectivity of polarized light s are close to 100% and 0. The inner diameter of said first single ring beam is greater than the outer diameter of said second single ring beam:

① According to the required double ring illumination mode, select corresponding said diffractive optical element 101;

② According to the required ring width w of the double ring illumination mode, determine the focal length f' of said zoom collimating lens group 102 by equations (1) and (4). Adjust the position(s) of the movable lens(es) of said zoom collimating lens group 102, so that its focal length equals f'.

③ According to the required energy distribution relationship $(A'_p{}^2 : A'_s{}^2)$ of inner and outer rings, determine the angle $\theta_0$ between the fast axis of said rotatable wave plate 2 and x-axis by equation (2). Adjust said rotatable wave plate 2, so that the angle between the fast axis of said rotatable wave plate 2 and x-axis equals $\theta_0$.

④ According to the required inner and outer diameters of inner ring, determine the distance $d_2$ between the conical tip of said second convex axicon 502 and said second movable mirror 503 by equation (7). The adjustment range of the distance $d_2$ between the conical tip of said second convex axicon 502 and said second movable mirror 503 should satisfy equation (10). Adjust said second movable mirror 503, so that the distance between the conical tip of said second convex axicon 502 and said second movable mirror 503 equals $d_2$.

⑤ According to the required inner and outer diameters of outer ring, determine the distance $d_1$ between the conical tip of said first convex axicon 402 and said first movable mirror 403 by equation (3). The adjustment range of the distance $d_1$ between the conical tip of said first convex axicon 402 and said first movable mirror 403 should satisfy equation (6). Adjust said first movable mirror 403, so that the distance between the conical tip of said first convex axicon 402 and said first movable mirror 403 equals $d_1$.

The method for generating off-axis single ring illumination mode contains the following implement methods:

1. For the 45° incidence angle of the beam incident on said polarization splitting film 303, the reflectivity and transmittance of polarized light s are close to 100% and 0, the transmittance and reflectivity of polarized light p are close to 100% and 0. The outer diameter of said first single ring beam is greater than or equal to the inner diameter of said second single ring beam and less than or equal to the outer diameter of said second single ring beam:

① According to the required single ring illumination mode, select corresponding said diffractive optical element 101;

② According to the required ring width w' of the single ring illumination mode, determine the ring widths w of said first single ring beam and said second single ring beam, the inner and outer diameters of said first single ring beam and the inner and outer diameters of said second single ring beam. The ring widths of said first single ring beam and said second single ring beam should satisfy the following equation:

$$w \leq w' \leq 2w$$

And determine the focal length f' of said zoom collimating lens group 102 by equations (1) and (4). With the determined inner and outer diameters of said first single ring beam and said second single ring beam, determine the distance $d_1$ between the conical tip of said first convex axicon 402 and said first movable mirror 403, and the distance $d_2$ between the conical tip of said second convex axicon 502 and said second movable mirror 503. The distance $d_1$ between the conical tip of said first convex axicon 402 and said first movable mirror 403 is determined by equation (3). The adjustment range of the distance $d_1$ between the conical tip of said first convex axicon 402 and said first movable mirror 403 should satisfy equation (6). The distance $d_2$ between the conical tip of said second convex axicon 502 and said second movable mirror 503 is determined by equation (7). The adjustment range of the distance $d_2$ between the conical tip of said second convex axicon 502 and said second movable mirror 503 should satisfy equation (10).

Adjust the position(s) of the movable lens(es) of said zoom collimating lens group 102, so that its focal length equals f'. Adjust said first movable mirror 403, so that the distance between the conical tip of said first convex axicon 402 and said first movable mirror 403 equals $d_1$. Adjust said second movable mirror 503, so that the distance between the conical tip of said second convex axicon 502 and said second movable mirror 503 equals $d_2$.

③ According to the required energy distribution relationship of single ring illumination mode, determine the angle $\theta_0$ between the fast axis of said rotatable wave plate 2 and x-axis by equation (2).

Adjust said rotatable wave plate 2, so that the angle between the fast axis of said rotatable wave plate 2 and x-axis equals $\theta_0$.

2. For the 45° incidence angle of the beam incident on said polarization splitting film 303, the reflectivity and transmittance of polarized light s are close to 100% and 0, the transmittance and reflectivity of polarized light p are close to 100% and 0. The outer diameter of said second single ring beam is less than the outer diameter of said first single ring beam and greater than or equal to the inner diameter of said first single ring beam:

① According to the required single ring illumination mode, select corresponding said diffractive optical element 101;

② According to the required ring width w' of the single ring illumination mode, determine the ring widths w of said first single ring beam and said second single ring beam, the inner and outer diameters of said first single ring beam and the inner and outer diameters of said second single ring beam. The ring widths of said first single ring beam and said second single ring beam should satisfy the following equation:

$$w \leq w' \leq 2w$$

And determine the focal length f' of said zoom collimating lens group 102 by equations (1) and (4). With the determined inner and outer diameters of said first single ring beam and said second single ring beam, determine the distance $d_1$ between the conical tip of said first convex axicon 402 and said first movable mirror 403, and the distance $d_2$ between the conical tip of said second convex axicon 502 and said second movable mirror 503. The distance $d_1$ between the conical tip of said first convex axicon 402 and said first movable mirror 403 is determined by equation (3). The adjustment range of the distance $d_1$ between the conical tip of said first convex axicon 402 and said first movable mirror 403 should satisfy equation (6). The distance $d_2$ between the conical tip of said second convex axicon 502 and said second movable mirror 503 is determined by t equation (7). The adjustment range of the distance $d_2$ between the conical tip of said second convex axicon 502 and said second movable mirror 503 should satisfy equation (10).

Adjust the position(s) of the movable lens(es) of said zoom collimating lens group 102, so that its focal length equals f'. Adjust said first movable mirror 403, so that the distance between the conical tip of said first convex axicon 402 and said first movable mirror 403 equals $d_1$. Adjust said second movable mirror 503, so that the distance between the conical tip of said second convex axicon 502 and said second movable mirror 503 equals $d_2$.

③ According to the required energy distribution relationship of single ring illumination mode, determine the angle $\theta_0$ between the fast axis of said rotatable wave plate 2 and x-axis by equation (2). Adjust said rotatable wave plate, so that the angle between the fast axis of said rotatable wave plate 2 and x-axis equals $\theta_0$.

3. For the 45° incidence angle of the beam incident on said polarization splitting film, the reflectivity and transmittance of polarized light p are close to 100% and 0, the transmittance and reflectivity of polarized light s are close to 100% and 0. The outer diameter of said first single ring beam is greater than or equal to the inner diameter of said second single ring beam and less than or equal to the outer diameter of said second single ring beam:

① According to the required single ring illumination mode, select corresponding said diffractive optical element 101;

② According to the required ring width w' of the single ring illumination mode, determine the ring widths w of said first single ring beam and said second single ring beam, the inner and outer diameters of said first single ring beam and the inner and outer diameters of said second single ring beam. The ring widths of said first single ring beam and said second single ring beam should satisfy the following equation:

$$w \leq w' \leq 2w$$

And determine the focal length f' of said zoom collimating lens group 102 by equations (1) and (4). With the determined inner and outer diameters of said first single ring beam and said second single ring beam, determine the distance $d_1$ between the conical tip of said first convex axicon 402 and said first movable mirror 403, and the distance $d_2$ between the conical tip of said second convex axicon 502 and said second movable mirror 503. The distance $d_1$ between the conical tip of said first convex axicon 402 and said first movable mirror 403 is determined by equation (3). The adjustment range of the distance $d_1$ between the conical tip of said first convex axicon 402 and said first movable mirror 403 should satisfy equation (6). The distance $d_2$ between the conical tip of said second convex axicon 502 and said second movable mirror 503 is determined by equation (7). The adjustment range of the distance $d_2$ between the conical tip of said second convex axicon 502 and said second movable mirror 503 should satisfy equation (10).

Adjust the position(s) of the movable lens(es) of said zoom collimating lens group 102, so that its focal length equals f'. Adjust said first movable mirror 403, so that the distance between the conical tip of said first convex axicon 402 and said first movable mirror 403 equals $d_1$. Adjust said second movable mirror 503, so that the distance between the conical tip of said second convex axicon 502 and said second movable mirror 503 equals $d_2$.

③ According to the required energy distribution relationship of single ring illumination mode, determine the angle $\theta_0$ between the fast axis of said rotatable wave plate 2 and x-axis by equation (2).

Adjust said rotatable wave plate, so that the angle between the fast axis of said rotatable wave plate 2 and x-axis equals $\theta_0$.

4. For the 45° incidence angle of the beam incident on said polarization splitting film 303, the reflectivity and transmittance of polarized light p are close to 100% and 0, the transmittance and reflectivity of polarized light s are close to 100% and 0. The outer diameter of said second single ring beam is less than the outer diameter of said first single ring beam and greater than or equal to the inner diameter of said first single ring beam:

① According to the required single ring illumination mode, select corresponding said diffractive optical element 101;

② According to the required ring width w' of the single ring illumination mode, determine the ring widths w of said first single ring beam and said second single ring beam, the inner and outer diameters of said first single ring beam and the inner and outer diameters of said second single ring beam. The ring widths of said first single ring beam and said second single ring beam should satisfy the following equation:

$$w \leq w' \leq 2w$$

And determine the focal length f' of said zoom collimating lens group 102 by equations (1) and (4). With the determined inner and outer diameters of said first single ring beam and said second single ring beam, determine the distance $d_1$ between the conical tip of said first convex axicon 402 and said first movable mirror 403, and the distance $d_2$ between the conical tip of said second convex axicon 502 and said second movable mirror 503. The distance $d_1$ between the conical tip of said first convex axicon 402 and said first movable mirror 403 is determined by equation (3). The adjustment range of the distance $d_1$ between the conical tip of said first convex axicon 402 and said first movable mirror 403 should satisfy equation (6). The distance $d_2$ between the conical tip of said second convex axicon 502 and said second movable mirror 503 is determined by equation (7). The adjustment range of the distance $d_2$ between the conical tip of said second convex axicon 502 and said second movable mirror 503 should satisfy equation (10).

Adjust the position(s) of the movable lens(es) of said zoom collimating lens group 102, so that its focal length equals f'. Adjust said first movable mirror 403, so that the distance between the conical tip of said first convex axicon 402 and said first movable mirror 403 equals $d_1$. Adjust said second movable mirror 503, so that the distance between the conical tip of said second convex axicon 502 and said second movable mirror 503 equals $d_2$.

③ According to the required energy distribution relationship of single ring illumination mode, determine the angle $\theta_0$ between the fast axis of said rotatable wave plate 2 and x-axis by equation (2).

Adjust said rotatable wave plate, so that the angle between the fast axis of said rotatable wave plate 2 and x-axis equals $\theta_0$.

In the embodiment, the inner diameter of said first single ring beam is greater than the outer diameter of said second single ring beam. Conventional illumination mode is generated by said diffractive optical element 101. The phase delay difference of fast and slow axis of said rotatable wave plate 2 is 90°. For the 45° incidence angle of the beam incident on said polarization splitting film 303, the reflectivity and transmittance of polarized light s are close to 100% and 0, the transmittance and reflectivity of polarized light p are close to 100% and 0. Both the angles between the fast axis of first quarter-wave plate 401 and second quarter-wave plate 501 and the positive direction of x-axis are 45°. All said optical elements are manufactured by fused silica or calcium fluoride. These materials possess high transmittance and good performance in the deep ultraviolet wavelength such as 193 nm and 248 nm.

EXAMPLE

In the FIG. 1, the wavelength and size of the square beam incident onto said illumination mode generation unit 1 are 193 nm and 15 mm×15 mm. The polarization direction is along y-axis. The half diffractive angle U' of said diffractive optical element 101 is 25 mrad. The focal length f' of said zoom collimating lens group 102 is 200 mm. From equation (1), it can be deduced that the diameter of the beam emitted from said illumination mode generation unit 1 is 10 mm, that is, w equals 5 mm. And the beam is circular linearly polarized one.

The components $A_s$ and $A_p$ of the beam incident onto said rotatable wave plate 2 are 0 and 1 respectively. The angle $\theta_0$ between the fast axis of said rotatable wave plate 2 and x-axis is 30°. From equation (2), it is deduced that the components $A'_s$ and $A'_p$ of the beam emitted from said illumination mode generation unit 1 are $$\frac{\sqrt{3}}{4} - i\frac{\sqrt{3}}{4} \text{ and } \frac{1}{4} + i\frac{3}{4}$$

respectively. That is, the energy ratio of said first single ring beam to said second single ring beam is about 5:3.

For the light incident onto said polarization beam splitter unit 3, polarized light p is transmitted through said polarization splitting film 303, while polarized light s is reflected by said polarization splitting film 303. The polarized light p is incident into said ring I generation unit 4. The polarized light p is converted to circularly polarized light beam after it passing through first quarter-wave plate 401. Then the converted circularly polarized light beam is shaped into first single ring beam after it passing through said first convex axicon 402. Further, the first single ring beam is reflected by said first movable mirror 403, and it goes back to said first quarter-wave plate 401 after it passing through said first convex axicon 402 again. The circularly polarized light beam is converted to polarized light s after it passing through said first quarter-wave plate 401. The polarized light s is reflected by said polarization splitting film 303 onto the pupil plane 6 where said first single ring beam is formed. The cone angle $\theta_1$ and bottom diameter $D_1$ of said first convex axicon 402 are 170° and 100 mm. The material of said first convex axicon 402 is fused silica and its index of reflection $n_1$ in 193 nm wavelength is 1.56. From equation (6), it is deduced that the adjustment range of distance $d_1$ between the conical tip $A_1$ of said first convex axicon 402 and said first movable mirror 403 is 50.6679 mm~506.6767 mm. From equations (3) and (5), it is deduced that the variation ranges of the inner diameter $D_{1i}$ and outer diameter $D_{1o}$ of said first single ring beam are 0.0061~90.0601 mm and 10.0061~100.0601 mm respectively. In this embodiment, $d_1$ equals 450 mm. From equations (3) and (5), it is deduced that the inner diameter $D_{1i}$ and outer diameter $D_{1o}$ of said first single ring beam are 78.8674 mm and 88.8674 mm respectively.

For the reflected polarized light s incident into said ring II generation unit 5, it is converted to circularly polarized light beam after it passing through second quarter-wave plate 501. Then the converted circular light beam is shaped into single ring beam after it passing through said second convex axicon 502. Further, this single ring beam is reflected by said second movable mirror 503, and it goes back to said second quarter-wave plate 501 after it passing through said second convex axicon 502 again. The circularly polarized light beam is converted to polarized light p after it passing through said second quarter-wave plate 501. The polarized light p is transmitted through said polarization splitting film 303 onto the pupil plane 6 where said second single ring beam is formed. The cone angle $\theta_2$ and bottom diameter $D_2$ of said second convex axicon 502 are 170° and 100 mm. The material of said first convex axicon 402 is fused silica and its index of reflection $n_2$ in 193 nm wavelength is 1.56. From equation (10), it is deduced that the adjustment range of distance $d_2$ between the conical tip $A_2$ of said second convex axicon 502 and said second movable mirror 503 is 50.6679 mm~506.6767 mm. From equations (7) and (9), it is deduced that the variation ranges of the inner diameter $D_{2i}$ and outer diameter $D_{2o}$ of said second single ring beam are 0.0061~90.0601 mm and 10.0061~100.0601 mm respectively. In this embodiment, $d_2$ equals 200 mm. From equations (7) and (9), it is deduced that the inner diameter $D_{2i}$ and outer diameter $D_{2o}$ of said second single ring beam are 29.4966 mm and 39.4966 mm respectively.

Figure 2A:
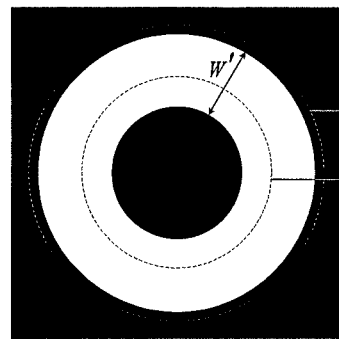
FIG. 2a, FIG. 2c, FIG. 2e, FIG. 2g illustrate the schematics of partial single ring illumination modes generated by this invention.
Figure 2B:
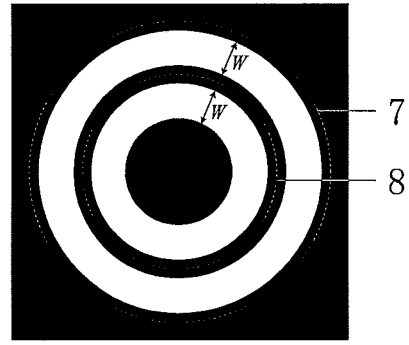
FIG. 2b, FIG. 2d, FIG. 2f, FIG. 2h illustrate the schematics of partial double ring illumination modes generated by this invention.
Figure 2C:
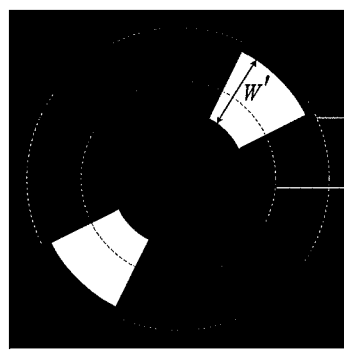
Figure 2D:
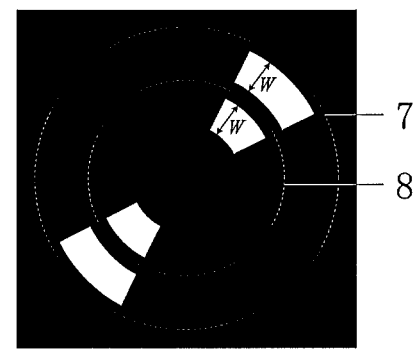
Figure 2E:
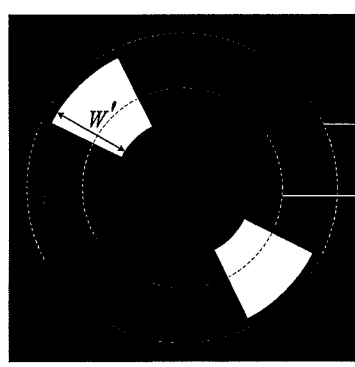
Figure 2F:
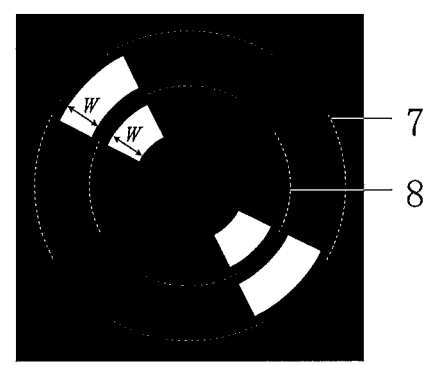
Figure 2G:
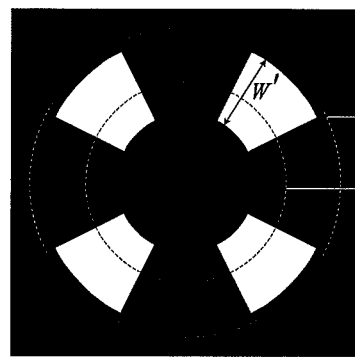
Figure 2H:
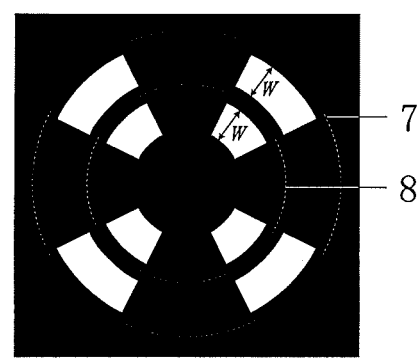
Figure 3:
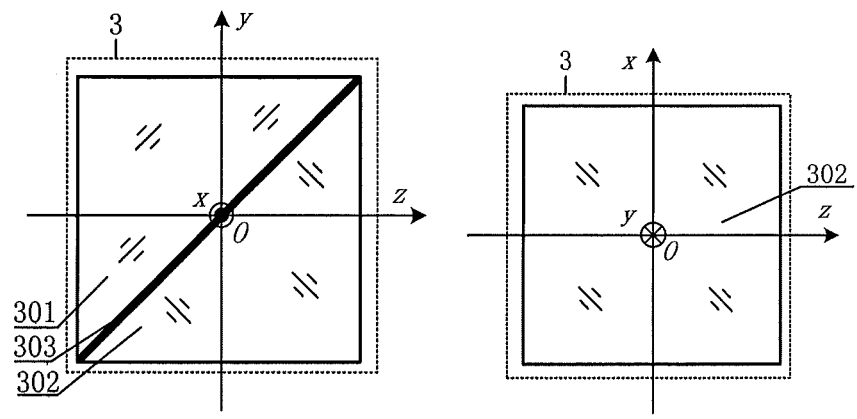
FIG. 3 illustrates the coordinate system used by this invention for ease description.
Figure 4:
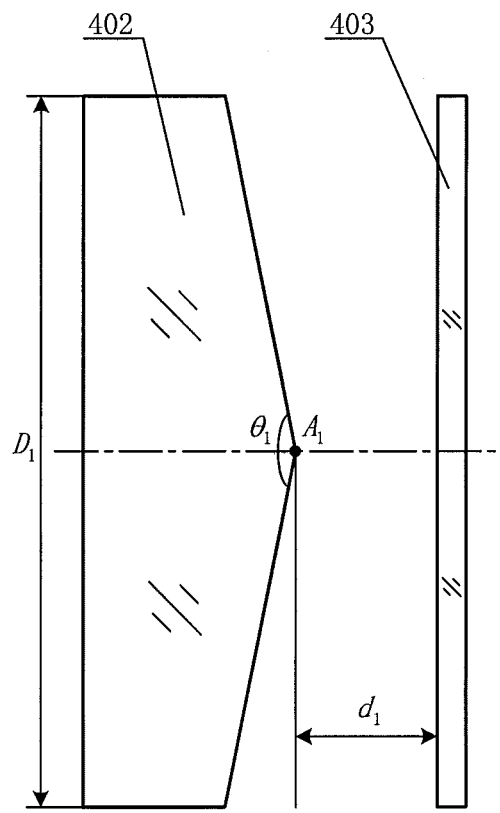
FIG. 4 illustrates the schematic of partial parameter annotations for said ring I generation unit.
Figure 5:
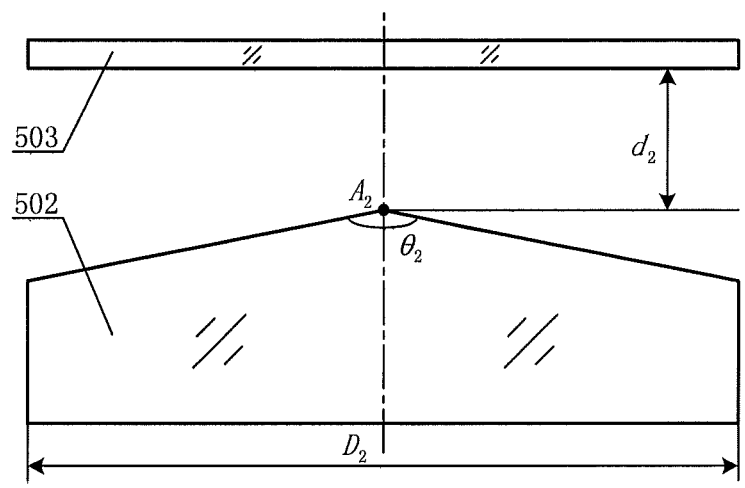
FIG. 5 illustrates the schematic of partial parameter annotations for said ring II generation unit.

In FIG. 2b, double ring illumination mode is formed at pupil plane 6. The energy ratio of inner to outer ring is about 3:5. The inner and outer diameters of the inner ring are 29.4966 mm and 39.4966 mm. The inner and outer diameters of the outer ring are 78.8674 mm and 88.8674 mm.

Experiments show that, through selecting corresponding diffractive optical element and appropriate adjustment, this invention can generate various illumination modes including single ring illumination mode and double rings illumination mode. The intensity and inner and outer diameters of these modes can be adjusted continuously.

The invention claimed is:

1. A lithography pupil shaping optical system comprising of illumination mode generation unit (1), rotatable wave plate (2), polarization beam splitter unit (3), ring I generation unit (4) and ring II generation unit (5), in which said illumination mode generation unit (1) is composed of diffractive optical element (101) and zoom collimating lens group (102); diffractive optical element (101) is exchangeable to achieve conventional, dipole, and quadrupole illumination modes, respectively; said ring I generation unit (4) is composed of first quarter-wave plate (401), first convex axicon (402) and first movable mirror (403); and said ring II generation unit (5) is composed of second quarter-wave plate (501), second convex axicon (502) and second movable mirror (503), the positions of the above components being as follows:

along the positive direction of z-axis, diffractive optical element (101), zoom collimating lens group (102), rotatable wave plate (2), polarization beam splitter unit (3), first quarter-wave plate (401), first convex axicon (402) and first movable mirror (403) are placed sequentially; the conical tip of said first convex axicon (402) is faced with said first movable mirror (403); said first movable mirror is coated with polarization-maintaining reflection film; and said first movable mirror possesses mechanical structures by which the distance between the conical tip of said first convex axicon and said first movable mirror can be adjusted continuously, and the light passing through said polarization beam splitter unit (3) is split into a reflected light and a transmitted light, and along the direction of the reflected light, said second quarter-wave plate (501), said second convex axicon (502) and said second movable mirror (503) are placed sequentially; the conical tip of said second convex axicon (502) is faced with said second movable mirror (503); said second movable mirror (503) is coated with polarization-maintaining reflection film; said second movable mirror possesses mechanical structures by which the distance between the conical tip of said second convex axicon and said second movable mirror can be adjusted continuously; and the rear surface of said diffractive optical element (101) is placed at the front focal plane of said zoom collimating lens group (102).

2. A method for generating an off-axis illumination mode using the lithography pupil shaping optical system according to claim 1, the method comprising the following steps:

① according to the required illumination mode, select corresponding said diffractive optical element;

② according to the required intensity distribution size of the illumination mode, adjust the focal length of said zoom collimating lens group;

③ according to the required energy distribution relationship of said first single ring beam to said second single ring beam, adjust the angle $\theta_0$ between the fast axis of said rotatable wave plate and x-axis;

④ according to the required inner and outer diameters of said first single ring beam, determine and adjust the distance $d_1$ between the conical tip of said first convex axicon and said first movable mirror;

⑤ according to the required inner and outer diameters of said second single ring beam, determine and adjust the distance $d_2$ between the conical tip of said second convex axicon and said second movable mirror; and ⑥ when said first single ring beam in step ④ and said single ring beam in step ⑤ overlap completely or partially, or when the inner or outer diameter of said first single ring beam in step ④ equals the outer or inner diameter of said second single ring beam in step ⑤, a single ring illumination mode is obtained; and, otherwise, a double ring illumination mode is obtained.

* * * * *